United States Patent
Endersz

[11] 3,982,211
[45] Sept. 21, 1976

[54] LINEARIZED VARACTOR FREQUENCY MODULATED SEMI-CONDUCTOR DIODE OSCILLATOR

[75] Inventor: György Géza Endersz, Alvsjo, Sweden

[73] Assignee: Telefonaktiebolaget L M Ericsson, Stockholm, Sweden

[22] Filed: May 1, 1975

[21] Appl. No.: 573,778

Related U.S. Application Data

[63] Continuation-in-part of Ser. No. 476,915, June 6, 1974, abandoned.

[30] Foreign Application Priority Data

June 25, 1973 Sweden .............................. 7308906

[52] U.S. Cl. .............................. 332/30 V; 331/96; 331/107 G; 331/177 V
[51] Int. Cl.² .............................................. H03C 3/22
[58] Field of Search .............. 331/96, 107 R, 107 G, 331/177 V; 332/30 V

[56] References Cited
UNITED STATES PATENTS

| | | |
|---|---|---|
| 3,711,792 | 1/1973 | Kaneko et al .................. 332/30 V X |
| 3,747,032 | 7/1973 | Hall et al ...................... 332/30 V X |
| 3,820,039 | 6/1974 | Farrer ......................... 331/177 V X |

*Primary Examiner*—Siegfried H. Grimm
*Attorney, Agent, or Firm*—Hane, Sullivan & Spiecens

[57] ABSTRACT

The present invention relates to a frequency modulated oscillator, preferably operating within the microwave range, comprising a resonator having a reversed biased semi-conductor element, for example, a Gunn diode and voltage dependent capacitor, for example a varactor diode acting as a frequency modulator and being connected to a modulating signal source. In order to linearize the modulation characteristic, there is a resonant circuit in the resonator which circuit is tuned to the first harmonic $2f_0$ of the unmodulated fundamental frequency $f_0$ of the oscillator. When modulating the varactor diode the resonant circuit becomes detuned and the voltage across the Gunn diode is changed so that its capacitance is also changed to change the fundamental frequency $f_0$ which compensates the non-linear change in the modulation characteristic of the varactor diode.

7 Claims, 9 Drawing Figures

3,982,211

LINEARIZED VARACTOR FREQUENCY MODULATED SEMI-CONDUCTOR DIODE OSCILLATOR

CROSS REFERENCE TO RELATED APPLICATION

This application is a continuation-in-part of application Ser. No. 476,915, filed June 6, 1974 and now abandoned.

BACKGROUND OF THE INVENTION

The present invention relates to apparatus for improving the linearity of a phase or frequency modulated oscillator, operating preferably within the microwave range. The apparatus according to the invention is applicable to oscillators which are used in broad band radio links, for example, for television transmission having great demands on noise characteristics, linearity and transmission capacity.

There are known frequency modulated microwave oscillators which utilize for frequency modulation active semi-conductor elements, for example, avalanche or Gunn diodes and capacitance diodes (varactor diodes). The U.S. Pat. No. 3,675,161, for example, describes a varactor controlled microwave semi-conductor oscillator in which an electromagnetic wave of microwave frequency is generated by means of a reversed biased semi-conductor diode of the avalanche type disposed in a cavity resonator. A varactor diode is used as a variable reactance element coupled to the semi-conductor diode for controlling the frequency of the generated wave. The semi-conductor diode acting as a negative resistance is connected to an external voltage, while the varactor diode is connected to a variable voltage source for varying the capacitance of the diode so that the frequency of the wave generated by the oscillator is changed. In this manner a microwave field is obtained from the oscillator cavity which is frequency modulated by the modulated signal and which is superimposed on the voltage supplied to the varactor diode.

One problem with frequency modulated oscillators of the above mentioned kind is that the relation between the frequency of the microwave signal generated in the oscillator and the modulating voltage is not linear. The reason for this non-linearity originates mainly from the non-linear properties of the varactor diode operating as frequency modulator. Furthermore, the generated microwave field contains harmonics of the second and higher orders due to the non-linearity in the frequency determining semi-conductor diode. However, it has been discovered that the presence of at least the first harmonic in the generated microwave field has a favorable influence on the efficiency of a frequency modulated oscillator which contains a Gunn diode or an avalanche diode as an active element.

A number of methods have previously been suggested to improve the linearity of a single tuned varactor modulated microwave oscillator. One method is to divide the original resonator to form two coupled resonators, one containing the varactor diode and the other containing the active semi-conductor element, for example, a Gunn diode. The latter resonator should then have the same construction as the original. By variation of the resonator parameters as, for example, the Q-value and the coupling factor between the resonators an improved linearity of the modulator can be obtained. The drawback with this known arrangement is mainly that a greater power loss is obtained and that the separate varactor resonator which is tuned closely to the oscillator frequency unfavorably affects the tuning of the frequency determining resonator and affects the matching to the load.

From, for example, U.S. Pat. No. 3,435,374, furthermore, it is known to improve the tuning properties of an oscillator containing a non-linear negative resistance by coupling one or several tuned resonant circuits to the included active element.

An object of the present invention is to provide apparatus for improving the linearity in a frequency or a phase modulated oscillator, preferably operating within the microwave range, wherein the apparatus at least partly compensates the influence of the first order distortion in the obtained modulated signal, whereby improved linearity of the oscillator is obtained with negligble power loss.

BRIEF DESCRIPTION OF THE DRAWING

The invention, the characteristics of which appear in the appended claims, will be described more fully with reference to the accompanying drawings in which:

DETAILED DESCRIPTION OF THE DRAWING

Figure 1:
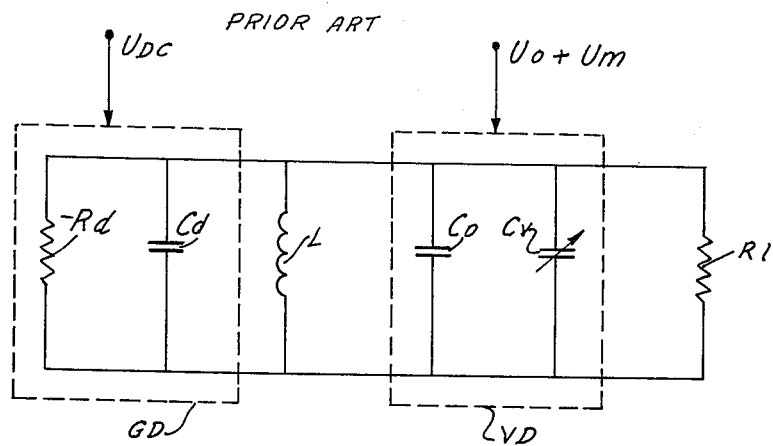
FIG. 1 shows an equivalent circuit diagram of a frequency modulated microwave microwave oscillator previously known in the form of a single tuned resonator.
Figure 2:
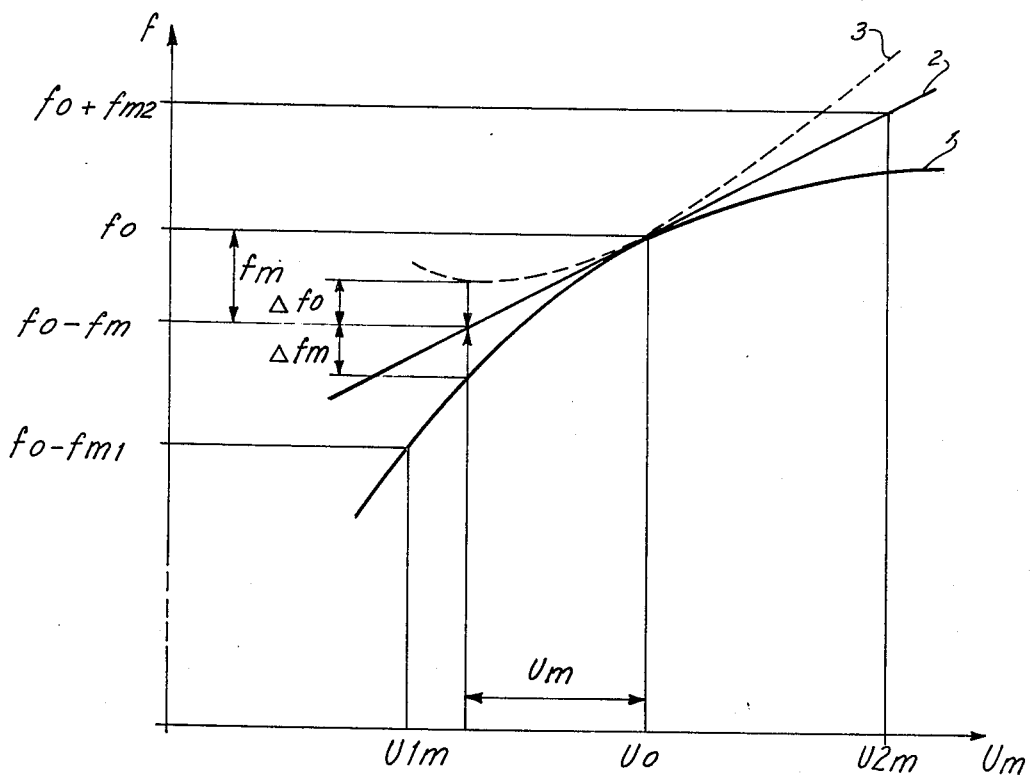
FIG. 2 shows a diagram for illustrating the modulation characteristic of the modulator according to FIG. 1.

The oscillator shown in FIG. 1 contains an active semi-conductor element in the form of a Gunn diode or an avalanche diode represented by the block GD. The reverse voltage necessary for the oscillation is achieved in known manner by means of the DC-voltage UDC connected to the semi-conductor element. When this element is reversed biased it can be represented by a negative resistance $-Rd$ in parallel with a capacitance $Cd$. A varactor diode is represented by the block VD which diode is connected to a DC-voltage $Uo$ having superimposed thereon a varying signal $Um$. The varactor diode can then be represented with its equivalent capacitance designated $Cv$, the value of which varies around a constant value $Co$ determined by the DC-voltage UO in dependence on the variation of the signal $Um$. The varactor diode will then operate as a frequency modulator coupled to the active semi-conductor element GD. The elements GD and VD are coupled in a resonator (not shown) in known manner, whose dimensions together with the reactances of the elements GD and VD determine the frequency of the generated microwave signal. The inductance L then represents the inductive reactance of the resonator and the resistance R1 represents the load. In the resonator a variable microwave field is obtained constituting the modulation signal and varying with the frequency $f = fo + fm$, where the fundamental frequency $fo$ is generated by the Gunn diode together with the varactor diode without applied modulating signal $Um$ and where the frequency $fm$ is dependent on the change of the capacitance of the varactor diode coupled to the Gunn diode caused by the applied modulation voltage $Um$. More exactly, the following equation defines the relation between the varactor capacitance and the supplied modulation voltage:

$Cv = Ud^{-n}$, where $n$ is a number which varies between the values ½ and ⅓ in dependence on the type of varactor diode used and where $Ud$ represents the sum of the DC-voltage $Uo$ and the modulating voltage $Um$. Since the above relation between $Cv$ and $Ud$ is non-linear, it is obvious that the modulation characteristic, i.e., frequency $fo$ as a function of $Um$ for the frequency modulator according to FIG. 1 is non-linear. Furthermore, since the frequency $f$ of the generated microwave field is inversely proportional to the square root of the equivalent capacitance and inductance of the resonator, the relationship between the frequency $f$ and the capacitance of the varactor will also be non-linear. In FIG. 2, curve 1, shows this relationship. It can be shown that it is the square term in the supplied modulation signal $Um$ which gives the greatest contribution to the non-linearity. The modulating signal $Um$ is assumed to vary over a certain interval $U1m \leq Um \leq U2m$ around the DC-voltage $Uo$. The corresponding frequency deviation between two frequency limits $fm1$ and $fm2$ around the center frequency $fo$ is designated $fm$. For the value $fm1$, $fo$ and $fm2$ the slope of the curve 1 is designated $s1$, $so$ and $s2$, respectively, the slope in the diagram being exaggerated so that the non-linear properties will be apparent. The linearity lin of the modulator is defined as $lin = 100 (s1-s2)/s0$ (%) and should, for transmission via a radio link, not exceed 1% at maximal frequency deviation.

Figure 3:
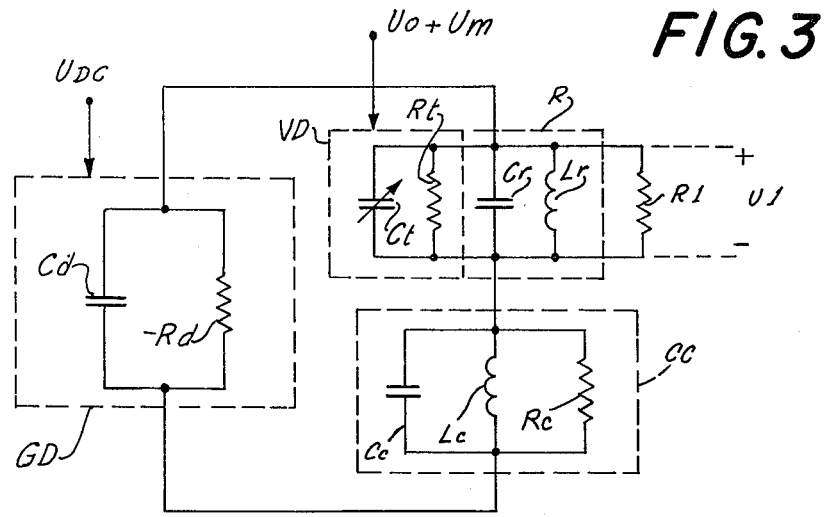
FIG. 3 shows an equivalent circuit diagram of a frequency modulated microwave oscillator containing the arrangement according to the present invention.

FIG. 3 shows an equivalent circuit diagram for a frequency modulated microwave oscillator containing the arrangement according to the present invention. As in the case according to FIG. 1, the surrounding resonator has not been shown but is represented by its equivalent circuit as will hereinafter become apparent. The varactor diode is represented within the block VD by its equivalent resistance $Rt$ and capacitance $Ct$. The active semi-conductor element is, for example, constituted by a Gunn diode and is represented within the block GD by the negative resistance $-Rd$ and the capacitance $Cd$. The inductance $Lr$ and the capacitance $Cr$ represent the equivalent reactances of the resonator. In the diagram according to FIG. 3, to explain the idea of the invention, the varactor diode is shown with its equivalent circuit components conductively connected to the equivalent components of the semi-conductor element. The circuit diagram according to FIG. 3 by means of coupling circuit CC including capacitor $Cc$, inductor $Lc$ and resistor $Rc$ intends to illustrate the fact that the varactor diode is weakly electromagnetic coupled to the active semi-conductor element so that the varactor diode, in contrast to the known oscillator according to FIG. 1, only to a small extent influences the field produced by the element GD. The variable capacitance $Ct$ and the resitance $Rt$ shown in FIG. 3 consequently constitute the transformed varactor capacitance and resistance, respectively. The resonant circuit which is formed by the equivalent reactances of the varactor diode and the semi-conductor element gives, due to their respective bias voltages, rise to an oscillating voltage $U1$ of the load $R1$ which voltage has the frequency $f$, the value of which varies around the frequency $fo$ by an amount $fm$ in dependence on the modulation of the varactor diode. The frequency $fo$ here represents as in the known case the frequency of the unmodulated oscillator determined by the properties of the semi-conductor element. The non-linear resistance $-Rd$ of the semi-conductor element gives, however, also without modulation, rise to harmonics in the modulated voltage $U1$. The first harmonic $2fo$ is important while the influence of harmonics of the second and higher orders are negligible. According to the gist of the invention and in order to linearize the frequency modulated oscillator, a resonant circuit is arranged in the resonator which is indicated in FIG. 3 by means of a parallel resonant circuit PR comprising elements $Cp$ and $Lp$. The resonant circuit PR is according to the idea of the invention tuned to the frequency $2fo$, i.e., to the first harmonic of the unmodulated fundamental frequency. In this way it will, due to its selective properties (see FIG. 4), have a small influence on the other circuits at the fundamental frequency $fo$ while at the first harmonic $2fo$ it is directly connected to the active semi-conductor element GD because at least the capacitance $Cr$ operates as a short circuit at this frequency. Since the varactor diode VD is weakly electromagnetic coupled to the semi-conductor element GD the varactor diode, because of the coupling of the resonant circuit to the semi-conductor element, will only be weakly coupled to the resonant circuit.

Figure 4:
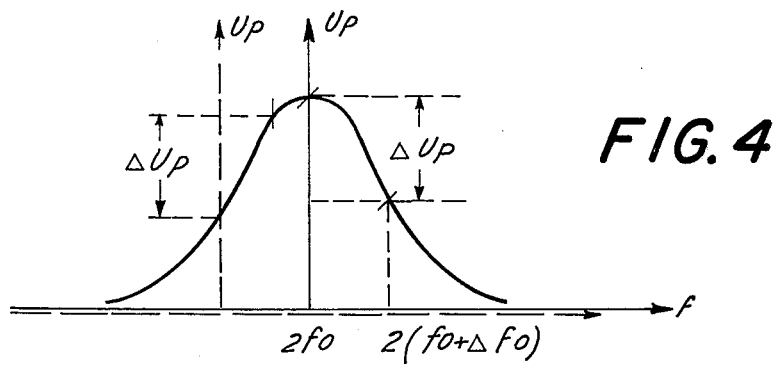
FIG. 4 shows a diagram of the voltage-frequency characteristic of the circuit of FIG. 3.
Figure 8:
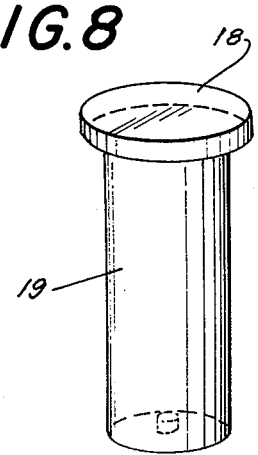
FIG. 8 is a perspective view of a diode holder.

The gist of the invention can be described in that a resonant circuit has been arranged in the resonator of the frequency modulated oscillator in such a manner that the circuit at the first harmonic operates as a parallel resonant circuit connected across the included active semi-conductor element. When the oscillator fundamental frequency $fo$ in the included varactor diode is modulated by the frequency $fm$, the frequency $fo$ is changed by an amount $\Delta fo$ and the frequency of the first harmonic generated by the semi-conductor element will also be changed by an amount $2 \Delta fo$. This implies that the parallel resonant circuit becomes detuned because its resonant peak value is situated at $2fo$. FIG. 4 illustrates this condition. From the Figure it is seen that during the frequency modulation, i.e., change in the frequencies $fo$ and $2fo$, the voltage $Up$ of the parallel resonant circuit PR drops an amount $\Delta Up$. A decrease in the voltage across the semi-conductor element GD is thus obtained causing the capacitance CD to change. Hereby one of the frequency determining reactances in the resonator is changed, whereby the frequency $fo$ is changed. It should be noted from FIG. 2 that for a certain control value $Um$ around the value $Uom$ of the modulator a certain deviation $\Delta fm$ arises in the frequency as it appears from the linear relation represented by curve 2. Hence, by changing the capacitance of the active semi-conductor element GD, whereby the base frequency $fo$ is changed, an additional value $\Delta fo$ in the frequency $fo$ equal to the deviation $\Delta fm$ can be obtained, i.e., compensation can be obtained. The change in the capacitance of the semi-conductor element dependent on a change in the frequency $fo$ can be made to compensate for the non-linear properties of the varactor modulator. In FIG. 2 the dashed curve 3 indicates the inverse non-linear case which shows the deviation in the frequency $fo$ from the linear case and which gives compensation for different values of the modulating voltage $Um$. By connecting an equivalent parallel resonant circuit according to what has been described above and by tuning the circuit to the first harmonic which is generated by this element an amplitude modulation of the frequency modulated signal is consequently obtained which endeavors to compensate for the deviation in the fundamental frequency $fo$ causing the deviation from the linear characteristic in the modulator, i.e., the varactor diode. Practical experiments have shown that it is a voltage increase $\Delta Up$ across the parallel resonant circuit which gives the compensation. However, it is possible even to obtain an increase in the voltage across the semi-conductor element by, from the beginning, tuning the parallel resonant circuit to a value less than $2fo$ as indicated in FIG. 4, the dashed axis of ordinates. A change in $fo$ corresponding to the change in the previous case instead gives a positive change in the voltage $Up$ and a corresponding change in the voltage across the Gunn diode.

The arrangement according to the invention is not limited to a single tuned resonant circuit PR. Compensation may also be obtained with a reactance circuit which is constructed by separate parallel and series resonant circuits. The reactance circuit is then so dimensioned that its transfer function $H(j\omega)$ has its poles situated in or close to a harmonic generated by the active semi-conductor element GD, for example, the first harmonic $2fo$. The compensation process can generally be described by a feedback circuit consisting of the frequency modulated oscillator containing the active semi-conductor element, the voltage dependent capacitance and the compensating resistance circuit in the feedback loop.

According to van der Pol "The non-linear theory of electric oscillations" from "Proceedings of the Institute of Radio Engineers", September 1934, especially page 1064, the fundamental frequency $\omega_o$ of a self oscillating oscillator is influenced or perturbed by the harmonic contents according to the formula $$\frac{\omega^2}{\omega_o^2} = \frac{\sum_{n=1}^{\infty} an^2}{\sum_{n=1}^{\infty} n^2 an^2}$$

where $an$ is the amplitude of the $n$:th harmonic, $\omega_o$ the unperturbed frequency of the oscillator and $\omega$ the corrected frequency if consideration is taken of the frequency perturbation. The assumption is that the self-oscillating oscillator, i.e., in the present case the active semi-conductor element, has a single indicating current and voltage characteristic.

If it is presumed that all harmonics are much less than the fundamental, i.e., $an << a1$ for $n \geq 2$, then $$\frac{\omega - \omega_o}{\omega_o} = \frac{\omega_a}{\omega_o} = -\sum_{n=1}^{\infty} \frac{n^2-1}{2} \left(\frac{an}{a1}\right)^2 \quad (1)$$

$\omega_a$ then represents the frequency perturbation, i.e., the change in the fundamental frequency $\omega_o$ of the oscillator dependent on the presence of the harmonics $n \cdot \omega_o$, where $n$ 2 according to the theory of van der Pol.

Specially, if only the first harmonic is of importance, i.e., $an = 0$ for $n \geq 3$, then $$\frac{\omega_a}{\omega_o} = -\frac{3}{2}\left(\frac{a_2}{a_1}\right)^2 \quad (2)$$

During the frequency modulation the fundamental frequency $\omega_o$ is changed by a value $\omega m$. The deviation of $\omega m$ from the linear progress dependent on the non-linearity of the voltage dependent capacitance can evidently, within a certain deviation, be compensated if $\omega a$ can be made dependent on $\omega m$. This relation of dependence can obviously be achieved by a reactance circuit according to the invention because a change in the modulating frequency $\omega m$ reacts on the magnitude of the amplitude $a2$ at, for example, the first harmonic (frequency $2\omega_o$) by the resonant circuit PR according to FIG. 3. A change in $a2$ implies that $\omega m$ is changed so that a resulting frequency $\omega mr$ is obtained and $\omega a$ will be dependent on $\omega mr$. Consequently $$\frac{\omega_a(\omega_{mr})}{\omega_o} = -\frac{3}{2}\left[\frac{a_2(\omega_{mr})}{a_1}\right]^2 \quad (3)$$

if influence from higher harmonics is neglected, compare equation (2).

In the general case the resonant circuit PR is constituted by a reactance circuit with the transfer function $H(j\omega)$, which consequently will determine the magnitude of the first harmonic $a_2$, i.e., $$a_2 = a_{20} \cdot |H(jw)| \quad (4)$$

where $a_{20}$ is a factor of proportion which is dependent on the amplitude of the first harmonic without the compensating reactant circuit according to the invention. The equation (4) substituted into the equation (3) gives:

$$\omega_a = -\frac{3}{2}\left(\frac{a_{20}}{a_1}\right)^2 \cdot |H(j\omega)|^2 \quad (5)$$

where $H(j\omega)$ is a function of $\omega mr$ and thus of the modulating voltage $Um$.

According to what has been mentioned above, it is mainly the square term in the modulation characteristic of the varactor modulator which gives rise to the non-linearity. In order to obtain full compensation it is consequently required that the square term in the expression for $\omega_a$ is equal to the square term in the modulation characteristic of the varactor diode $\omega m = \omega m$ ($Um$). This can be expressed $$\left|\left|\frac{d^2\omega_m}{dU_m^2}\right| - \left|\frac{d^2\omega_a}{dU_m^2}\right|\right| \leq \epsilon$$

where $\epsilon = 0$ if full compensation is to be obtained, but $\epsilon$ can also constitute a small positive number of a certain non-linearity for a certain frequency deviation can be tolerated.

The expression $$\frac{d^2\omega_m}{dU_m^2}$$

is obtained from the modulation characteristic of the varactor modulator which is known and an expression for $$\frac{d^2\omega_n}{dU_m^2}$$

is obtained from the equation (5), since the transfer function is a function of $\omega mr$ and by that also a function of $Um$, the derivatives mutually having different signs.

In the case the reactance circuit is constituted by a simple parallel resonant circuit, then $$H(j\omega) = \frac{1}{1 + Q^2 \cdot \left(\frac{\omega}{\omega_o} - \frac{\omega_o}{\omega}\right)^2}$$

where Q is the loaded figure of merit of the resonant circuit. If A designates the ratio between the total capacitance of the oscillator circuit and the blocking layer capacitance of the varactor modulator it can be shown that for full compensation at the deviation zero $$\left(\frac{a_{20}}{a_1}\right)^2 = \frac{A}{2Q^2}$$

This condition, except that the resonant circuit is tuned to the first harmonic $2\omega o$, must obviously be fulfilled in order to obtain compensation.

Figure 5:
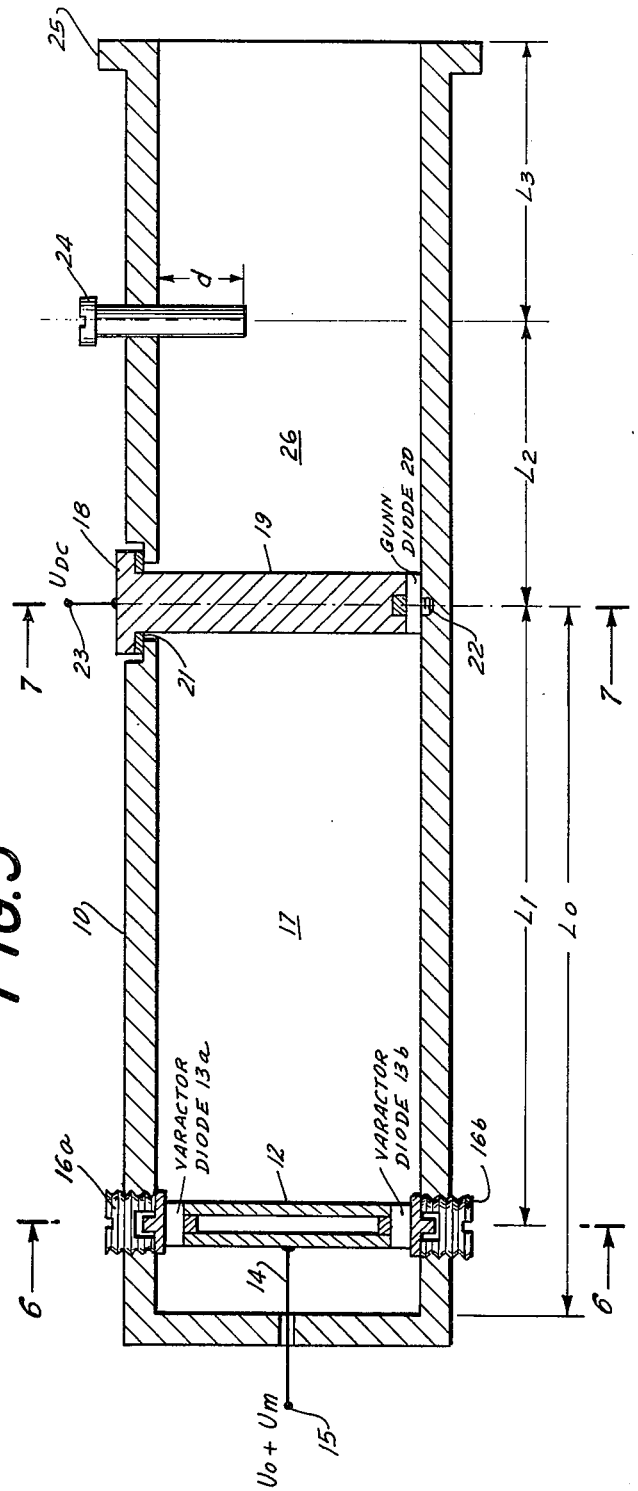
FIG. 5 shows a longitudinal section of the oscillator according to FIG. 3.
Figure 7:
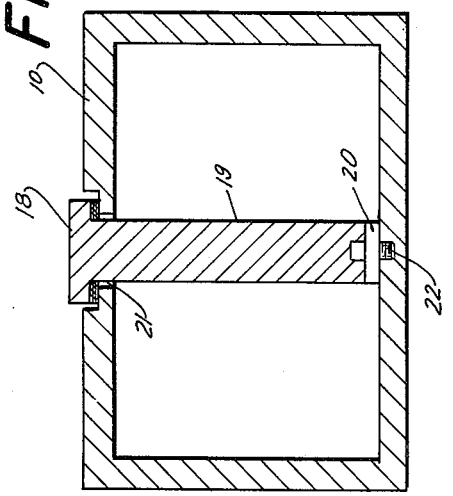
FIG. 7 is a cross-section taken along the line 7—7 of FIG. 5.
Figure 6:
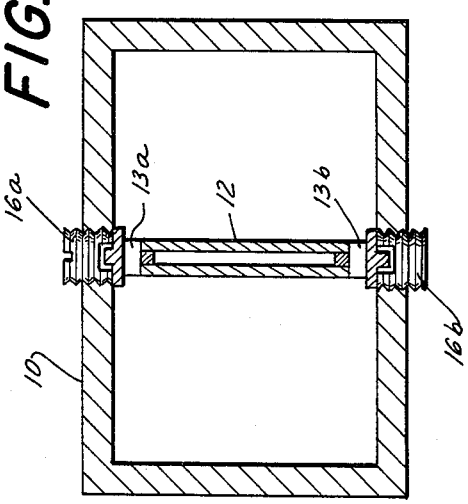
FIG. 6 is a cross-section taken along the line 6—6 of FIG. 5.

With reference to FIG. 5, a practical embodiment of a frequency modulated oscillator including an arrangement according to the present invention will be described more in detail.

A rectangular waveguide section is represented by numeral 10. The frequency modulator in the form of a voltage dependent capacitance consists of a matched pair of equal varactors 13a, 13b which are weakly and broad band coupled to a resonator cavity 17. The active semi-conductor element, generating the fundamental frequency wave (frequency $fo$), consists of a Gunn diode represented by 20.

Figure 9:
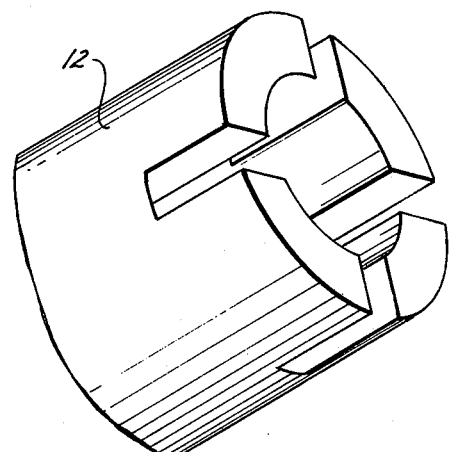
FIG. 9 is a perspective view of one end of another diode holder.

The varactors 13a, 13b are mounted on a metallic part which consists of a hollow cylinder 12 having two open ends into which the cylindrical and metallic part of the two diodes have been thread. Preferably both ends of the cylinder 12 have slots along the circumferential surface, so that the top cylindrical part of the diodes 13a, 13b can be firmly fitted into the cylinder (see FIG. 9). The middle ceramic part of the diodes 13a, 13b is supported by the short sides of the cylinder 12. The metallic base part of the diodes 13a, 13b is supported by a screw 16a, 16b which have been inserted into threaded holes in the waveguide wall 10. An isolated conductor 14 is inserted through a hole in the waveguide wall and applied to the circumferential surface of the cylinder 12. Across the terminal 15 of the conductor 14 the external voltage $Uo + Um$ is applied, where $Uo$ as above represents a DC-voltage and $Um$ the modulating voltage.

The Gunn diode 20 is disposed in a bore of the waveguide wall 10 by means of a pin or a screw 22. The Gunn diode 20 has been applied to one end of a solid metallic element having an upper part 18 and a lower part 19. A mica plate 21 is disposed between the upper part 18 and the wall 10 to conduct the arising radio frequency field emanating from external voltage sources. Numeral 23 indicates the terminal for applying a DC bias voltage UDC to the Gunn diode 20. The whole waveguide section suitably constitutes reference potential (ground) for the voltages $Uo$, $Um$ and UDC. No parts of the metallic elements 12 and 18, 19 touches the waveguide wall 10.

The resonant cavity 17, the length of which is indicated by L0, is limited by the left short side of the waveguide wall 10 and the center line of the metallic element 18, 19. In the cavity 17 an electromagnetic field appears which consists of a circulating and longitudinal magnetic field and a transverse directed electric field. The maximum of the magnetic field appears near the transverse waveguide plane through the varactor diode and the maximum of the electric field appears at a distance equal to ½ L0 from one end of the cavity.

The distance L1 between the center lines of the cylinder 12 and the element 18, 19 is chosen so that weak electromagnetic coupling of the varactor diodes 13a, 13b to the cavity 17 is obtained, the length L1 being preferably chosen approximatively equal to the length L0.

The resonant circuit, above represented by reference PR, is constituted by a screw 24 which is inserted into a bore in the waveguide wall 10 and extends to a depth $d$ into the waveguide space. The electrical distance corresponding to the distance L2 between the center line of screw 24 and the Gunn diode 20 constitutes an odd number of wave lengths of the field arising in the cavity resonator 26 (frequency $fo$). The inductance and the capacitance of the screw 24 will, as regards for circuit, operate as an equivalent parallel resonant circuit, tuned to the frequency $2fo$ and being coupled to the Gunn diode 20 as described above. By varying the distance $d$ the tuning of the resonant circuit to the frequency $2fo$ can be carried out.

The output of the oscillator is constituted by the electromagnetic field (a standing wave0 appearing in the waveguide to the right of the screw 24. An external load, for example, an antenna or an amplifier can be connected to the waveguide flange 25 and there is no specific requirement as to the distance L3 in FIG. 5.

While the waveguide section has been shown as a rectangular guide, other cross-sections such as elliptical can be used.

While the invention has been described in detail with respect to a certain now preferred example and embodiment of the invention, it will be understood by those skilled in the art, after understanding the invention, that various changes and modifications may be made without departing from the spirit and scope of the invention, and it is intended therefore, to cover all such changes and modifications in the appended claims.

What is claimed is:

1. A linearized frequency modulated semiconductor oscillator, preferably operating in the microwave range, comprising: an active semiconductor element for generating a wave having a fundamental frequency and at least a second harmonic frequency; a frequency modulator in the form of a voltage dependent capacitor, adapted to be connected to a source of constant voltage upon which is superimposed a modulating voltage; and a reactance circuit for compensating for non-linear changes in the capacitance of said capacitor and to compensate for the non-linearity in the fundamental frequency due to the change in said capacitance, said reactance circuit having a transfer function $H(j\omega)$ with poles situated in or close to the frequency location of one of the harmonics of said semiconductor element, and said reactance circuit at one of these harmonics being strongly coupled to said semiconductor element, but weakly coupled to said voltage dependent capacitor, the absolute value $|H(j\omega)|$ of said transfer function being chosen so that $$\left| \left| \frac{d^2 \omega_n}{d U m^2} \right| - \left| \frac{d^2 \omega_m}{d U m^2} \right| \right| \leq \epsilon$$

where $Um$ indicates the modulating voltage, and $\omega m$ indicates the corresponding deviation from the oscillator fundamental frequency, the factor $$\frac{d^2 \omega_m}{d U m^2}$$

being given from the modulation characteristic of the frequency modulator and having an opposite sign relatively the factor $$\frac{d^2 \omega_n}{d U m^2},$$

frequency perturbation $\omega a$ caused by the harmonics of the semiconductor element being determined by the relation $$\omega_n = \frac{n^2-1}{2} \left( \frac{an}{al} \right)^2 \left| H(j\omega) \right|^2$$

where $n = 1, 2, 3, \ldots$ is the order number of the chosen harmonic, $an/al$ is the amplitude of the n:th harmonic normalized to the fundamental $al$. and $\epsilon$ is a number determined by the desired linearity within the actual deviation range.

2. The oscillator according to claim 1, wherein the reactance circuit comprises a resonant circuit coupled to said active semiconductor element, said resonant circuit being tuned to or closely to the second harmonic of said active semiconductor element and having a loaded figure of merit Q which satisfies the relation $$Q^2 = K \cdot \frac{A}{a20^2}$$

where K is a constant of proportionality, A is the ratio between the total capacitance and the blocking layer capacitance of the voltage dependent capacitor, and $a20$ is the amplitude of the second harmonic generated by the active semiconductor element.

3. The oscillator according to claim 2, wherein the resonant circuit includes a parallel resonant circuit.

4. The oscillator according to claim 2 wherein the resonant circuit includes a series resonant circuit.

5. The oscillator according to claim 2 wherein the active semiconductor element comprises a diode having negative resistance, wherein the voltage dependent capacitor comprises at least one varactor diode, said diodes being disposed in a resonator formed by a wave guide and spaced from each other by such a distance that there is electromagnetic coupling between them at the generated fundamental frequency, and wherein the resonant circuit comprises a metallic element fitted in the wall of the wave guide remote from the resonator formed by said diodes and the wave guide and at an electrical distance of an odd number of quarter wave lengths from said negative resistance diode, whereby the resonant circuit at said second harmonic generated by said diode is strongly electromagnetic coupled to the same.

6. The oscillator according to claim 5, wherein said negative resistance diode is a Gunn diode.

7. The oscillator according to claim 5, wherein the metallic element is a screw inserted into the wave guide wall, the series inductance and series capacitance relative the wave guide being adjusted for resonance at said second harmonic.

* * * * *